(12) United States Patent
Yang et al.

(10) Patent No.: US 10,026,731 B1
(45) Date of Patent: Jul. 17, 2018

(54) COMPOUND SEMICONDUCTOR TRANSISTOR INTEGRATION WITH HIGH DENSITY CAPACITOR

(71) Applicant: QUALCOMM Incorporated, San Diego, CA (US)

(72) Inventors: Bin Yang, San Diego, CA (US); Xia Li, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 15/488,108

(22) Filed: Apr. 14, 2017

(51) Int. Cl.
*H01L 29/20* (2006.01)
*H01L 27/06* (2006.01)
*H01L 49/02* (2006.01)
*H01L 29/737* (2006.01)

(52) U.S. Cl.
CPC ...... *H01L 27/0658* (2013.01); *H01L 27/0605* (2013.01); *H01L 28/87* (2013.01); *H01L 28/91* (2013.01); *H01L 29/20* (2013.01); *H01L 29/7371* (2013.01)

(58) Field of Classification Search
CPC . H01L 27/0658; H01L 27/0605; H01L 28/87; H01L 28/91; H01L 29/20
See application file for complete search history.

(56) References Cited

U.S. PATENT DOCUMENTS

| | | | |
|---|---|---|---|
| 4,868,613 A | 9/1989 | Hirachi | |
| 5,268,315 A * | 12/1993 | Prasad | H01L 21/30612 148/DIG. 9 |
| 5,869,381 A | 2/1999 | Hebert et al. | |
| 5,953,617 A * | 9/1999 | Lee | H01L 27/305 257/E27.12 |
| 6,833,606 B2 | 12/2004 | Nakamura et al. | |
| 2001/0042867 A1 | 11/2001 | Furuhata | |
| 2003/0141518 A1 * | 7/2003 | Yokogawa | H01L 21/8252 257/194 |
| 2004/0169197 A1 * | 9/2004 | Nakamura | H01L 21/8252 257/197 |
| 2007/0023901 A1 * | 2/2007 | Mahoney | H01L 24/05 257/736 |

(Continued)

*Primary Examiner* — Fazli Erdem
(74) *Attorney, Agent, or Firm* — Seyfarth Shaw LLP

(57) ABSTRACT

A metal-insulator-metal (MIM) capacitor includes a compound semiconductor substrate. The MIM capacitor includes a collector contact layer on the compound semiconductor substrate, a first dielectric layer on the collector contact layer, a conductive electrode layer on the first dielectric layer, and a second dielectric layer on the conductive electrode layer. The MIM capacitor includes a first conductive interconnect on the second dielectric layer, a third dielectric layer on the first conductive interconnect, and a second conductive interconnect on the third dielectric layer. A first capacitive component includes the collector contact layer, the conductive electrode layer, and the first dielectric layer. A second capacitive component includes the first conductive interconnect, the conductive electrode layer and the second dielectric layer. A third capacitive component includes the second conductive interconnect, the first conductive interconnect, and the third dielectric layer. The first, second, and third capacitive components are arranged in parallel with each other.

22 Claims, 10 Drawing Sheets

(56) References Cited

U.S. PATENT DOCUMENTS

| | | | | |
|---|---|---|---|---|
| 2013/0026541 A1* | 1/2013 | Kurokawa | .......... | H01L 21/8252 257/195 |
| 2014/0138793 A1* | 5/2014 | Chidambaram | .... | H01L 23/5228 257/532 |
| 2014/0312390 A1* | 10/2014 | Tsai | .................... | H01L 29/7302 257/197 |
| 2016/0204099 A1 | 7/2016 | Kawai et al. | | |

* cited by examiner

COMPOUND SEMICONDUCTOR TRANSISTOR INTEGRATION WITH HIGH DENSITY CAPACITOR

BACKGROUND

Field

The present disclosure relates generally to wireless communication systems, and more specifically, to a compound semiconductor transistor integrated with a high density capacitor.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), and the like.

Further design challenges for mobile RF transceivers include analog/RF performance considerations, including mismatch, noise, and other performance considerations. The design of these mobile RF transceivers includes the use of additional passive devices, for example, to suppress resonance, and/or to perform filtering, bypassing, and coupling. Unfortunately, integration of passive devices and compound semiconductor transistors is problematic.

SUMMARY

A metal-insulator-metal (MIM) capacitor includes a compound semiconductor substrate. The MIM capacitor includes a collector contact layer on the compound semiconductor substrate, a first dielectric layer on the collector contact layer, a conductive electrode layer on the first dielectric layer, and a second dielectric layer on the conductive electrode layer. The MIM capacitor includes a first conductive interconnect on the second dielectric layer, a third dielectric layer on the first conductive interconnect, and a second conductive interconnect on the third dielectric layer. A first capacitive component includes the collector contact layer, the conductive electrode layer, and the first dielectric layer. A second capacitive component includes the first conductive interconnect, the conductive electrode layer and the second dielectric layer. A third capacitive component includes the second conductive interconnect, the first conductive interconnect, and the third dielectric layer. The first, second, and third capacitive components are arranged in parallel with each other.

A method of making a high density metal-insulator-metal (MIM) capacitor may include depositing a first dielectric layer on a collector contact layer on a compound semiconductor substrate and depositing a conductive electrode layer on the first dielectric layer to form a first capacitive component. The method may also include depositing a second dielectric layer on the conductive electrode layer and forming a first conductive interconnect on the second dielectric layer forms a second capacitive component. The method may further include depositing a third dielectric layer on the first conductive interconnect and forming a second conductive interconnect on the third dielectric layer forms a third capacitive component. The third capacitive component may be arranged in parallel with the second capacitive component and the first capacitive component.

A MIM capacitor may include means for supporting the MIM capacitor. The MIM capacitor may also include a collector contact layer on the means for supporting, a first dielectric layer on the collector contact layer, a conductive electrode layer on the first dielectric layer. The MIM capacitor may further include a second dielectric layer on the conductive electrode layer, a first conductive interconnect on the second dielectric layer, a third dielectric layer on the first conductive interconnect, and a second conductive interconnect on the third dielectric layer. A first capacitive component may include the collector contact layer, the conductive electrode layer, and the first dielectric layer. A second capacitive component may include the first conductive interconnect, the conductive electrode layer, and the second dielectric layer. A third capacitive component may include the second conductive interconnect, the first conductive interconnect, and the third dielectric layer. The first, second, and third capacitive components may be arranged in parallel with each other.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
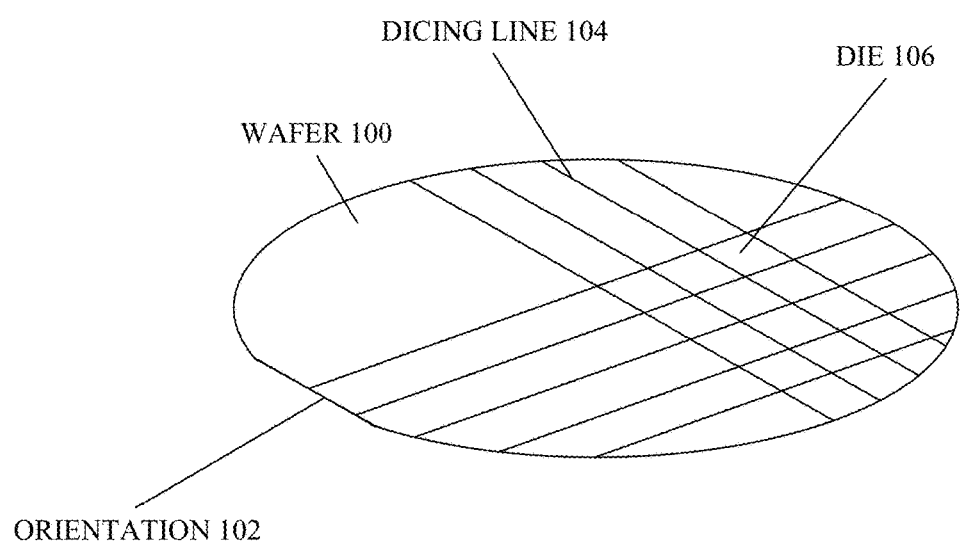
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Fabrication of mobile radio frequency (RF) chip designs (e.g., mobile RF transceivers) becomes complex at deep sub-micron process nodes due to cost and power consumption considerations. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high electron mobility transistors (HEMTs), pseudomorphic high electron mobility transistors (PHEMTs), and the like.

Further design challenges for mobile RF transceivers include analog/RF performance considerations, such as mismatch, noise, and other performance considerations. The design of these mobile RF transceivers includes the use of additional passive devices, for example, to suppress resonance, and/or to perform filtering, bypassing, and coupling. Unfortunately, integration of passive devices and compound semiconductor transistors, such as bipolar transistors, is problematic.

Bipolar transistors, which are also referred to as bipolar junction transistors (BJTs), are a type of transistor that uses both hole charge and electron carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. The III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers.

A relatively small number of silicon based CMOS transistors are used to manufacture RF power amplifiers. Highly complex and highly integrated baseband and transceiver RF integrated circuits involve advanced, reduced gate-length CMOS processes for integrating functions in very small die. For example, within an RF front end module, CMOS processes are used to manufacture the switch as well as the digital controls. Conversely, compound semiconductor heterojunction bipolar transistors are used for implementing power amplifiers.

Successful fabrication of modern semiconductor chip products, such as integrated compound semiconductor transistors and passive devices, involves interplay between the materials and the processes employed. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes to form interconnects (e.g., M1, M2, M3, M4, etc.) The front-end-of-line processes may include the set of process steps that form the active devices, such as transistors, capacitors, and diodes.

The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to back-end-of-line interconnects. These steps include silicidation and contact formation as well as stress introduction. The back-end-of-line processes may include the set of process steps that form the interconnects that tie the independent transistors and form circuits.

A heterojunction bipolar transistor (HBT) is one example of a compound semiconductor transistor. A heterojunction bipolar transistor integrated circuit (HBT chip) may integrate a resistor, a capacitor, and a heterojunction bipolar transistor to provide, for example, a power amplifier. Unfortunately, a capacitor (e.g., a metal insulator metal (MIM) capacitor) may occupy as much as twenty percent (20%) of the HBT chip area due a limited range of dielectric materials available in the HBT process. That is, compound semiconductor (e.g., column III and column V (III-V) material) dielectrics are generally unavailable, thereby making it difficult to fabricate capacitors (e.g., a MIM capacitor) in compound semiconductor devices. By contrast, a CMOS (complementary metal-oxide-semiconductor) silicon based MIM capacitor may exhibit a capacitance density four times (4×) greater than a compound semiconductor MIM capacitor.

Aspects of the present disclosure may solve this problem by integrating a compound semiconductor transistor (e.g., compound semiconductor field effect transistor, a heterojunction bipolar transistor, a high-electron-mobility-transistor (HEMT), etc.) with a high density, compound semiconductor metal-insulator-metal (MIM) capacitor (CAP). Replacing the compound semiconductor MIM capacitor of the HBT chip with a high density compound semiconductor MIM capacitor increases capacitance density (e.g., a 300%-600% increase). The high density compound semiconductor MIM capacitor may occupy a substantially reduced capacitor area (e.g., by ⅓ to ⅙ of the original size). This HBT chip area reduction may significantly reduce the HBT chip cost (e.g., by 13%-16% (from ~20%)). In addition, integration of the high density compound semiconductor MIM capacitor in the HBT chip is performed without modification of the HBT process and without sacrificing performance of the HBT. Integration of the high density compound semiconductor MIM capacitor in the HBT chip also does not involve an additional mask.

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be composed of a compound semiconductor material, such as gallium arsenide (GaAs, InP) or gallium nitride (GaN), a ternary material such as indium gallium arsenide (InGaAs, AlGaAs, InGaSb), quaternary materials (InGaAsP), or any material that can be a substrate material for other compound semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

After the wafer 100 is processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

After the wafer 100 is separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
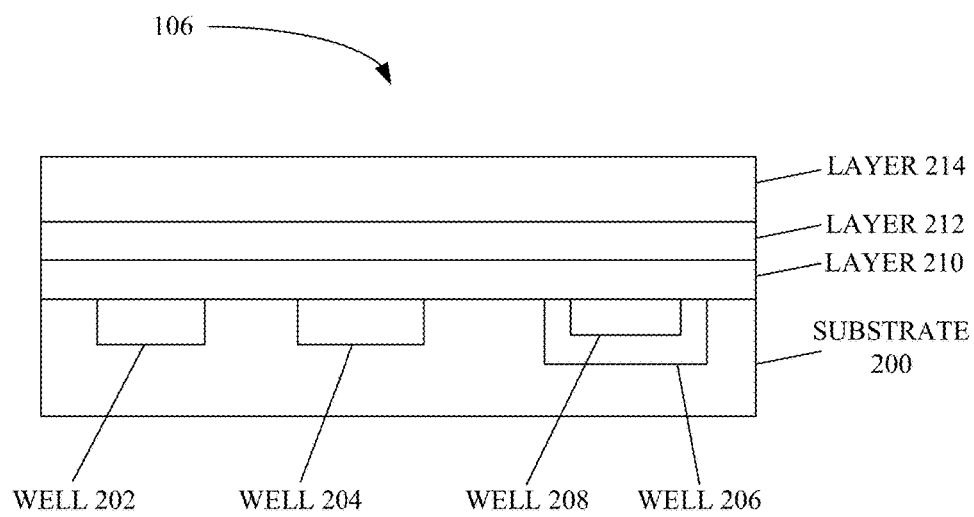
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

The semiconductor substrate may also have a well 206 and a well 208. The well 208 may be completely within the well 206, and, in some cases, may form a bipolar junction transistor (BJT), a heterojunction bipolar transistor (HBT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. Aspects of the present disclosure include integration of a high density, compound semiconductor transistor with a compound semiconductor transistor, such as a heterojunction bipolar transistor.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. The III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers of a radio frequency (RF) front end module, for example, as shown in FIG. 3.

Figure 3:
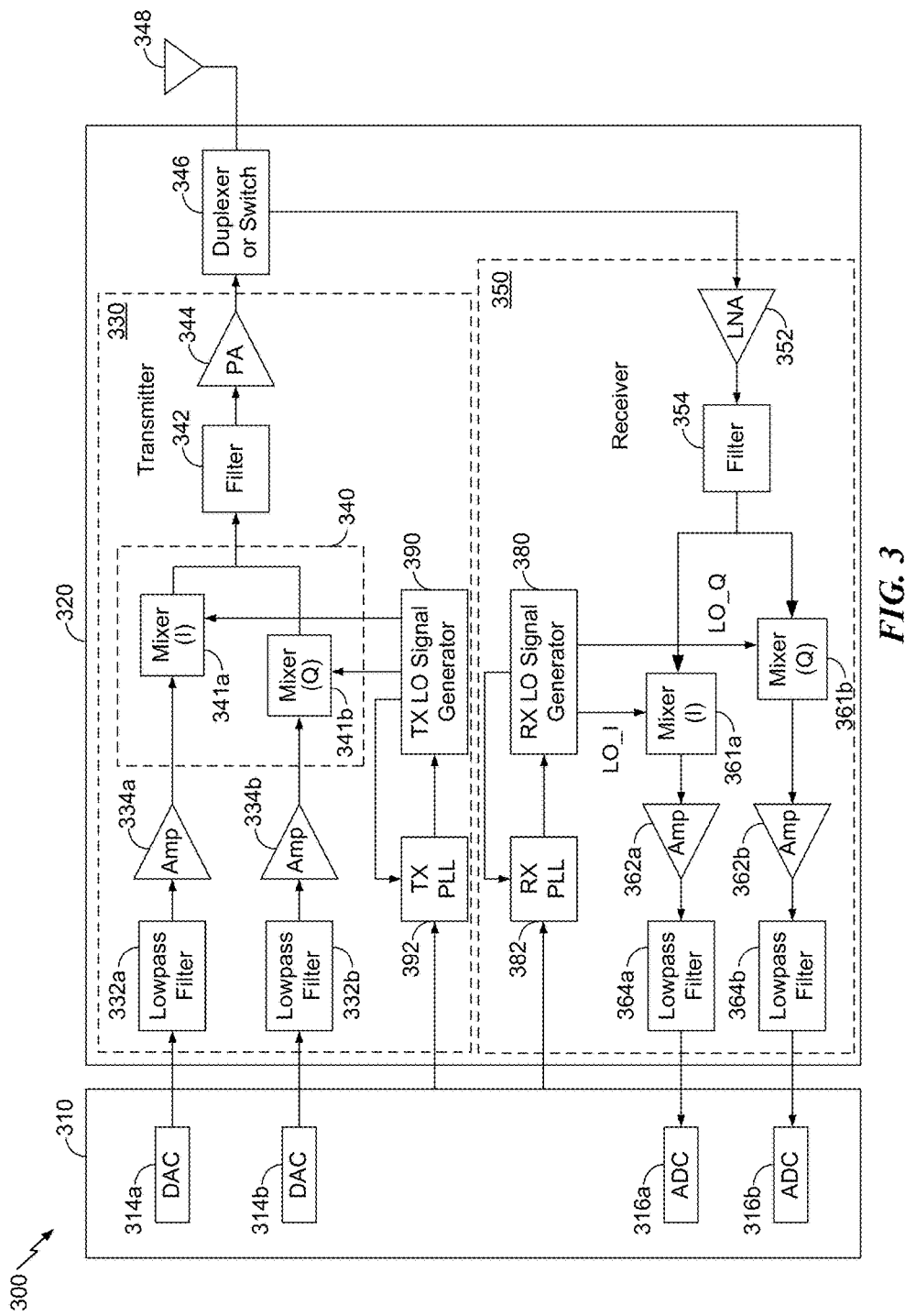
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal are generally selected to operate at substantially higher frequencies. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

A heterojunction bipolar transistor integrated circuit (HBT chip) may integrate a resistor, a capacitor, and a heterojunction bipolar transistor to provide, for example, a power amplifier. Unfortunately, a capacitor (e.g., a metal insulator metal (MIM) capacitor) may occupy a substantial portion of the HBT chip area due to a limited range of dielectric materials available in the HBT process. That is, compound semiconductor (e.g., column III and column V (III-V) material) dielectrics are generally unavailable, thereby making it difficult to fabricate capacitors (e.g., a MIM capacitor) in compound semiconductor devices. By contrast, a CMOS (complementary metal-oxide-semiconductor) silicon based MIM capacitor may exhibit a substantially increased capacitance density relative to a compound semiconductor MIM capacitor.

Aspects of the present disclosure may solve this problem by integrating a compound semiconductor transistor (e.g., compound semiconductor field effect transistor, a heterojunction bipolar transistor, a high-electron-mobility-transistor (HEMT), etc.) with a high density, compound semiconductor metal-insulator-metal (MIM) capacitor (CAP). Integration of the high density compound semiconductor MIM capacitor in the HBT chip may be performed without modification of the HBT process and without sacrificing performance of the HBT. Integration of the high density compound semiconductor MIM capacitor in the HBT chip may also not involve an additional mask, while reducing a footprint of the compound semiconductor MIM capacitor.

Figure 4:
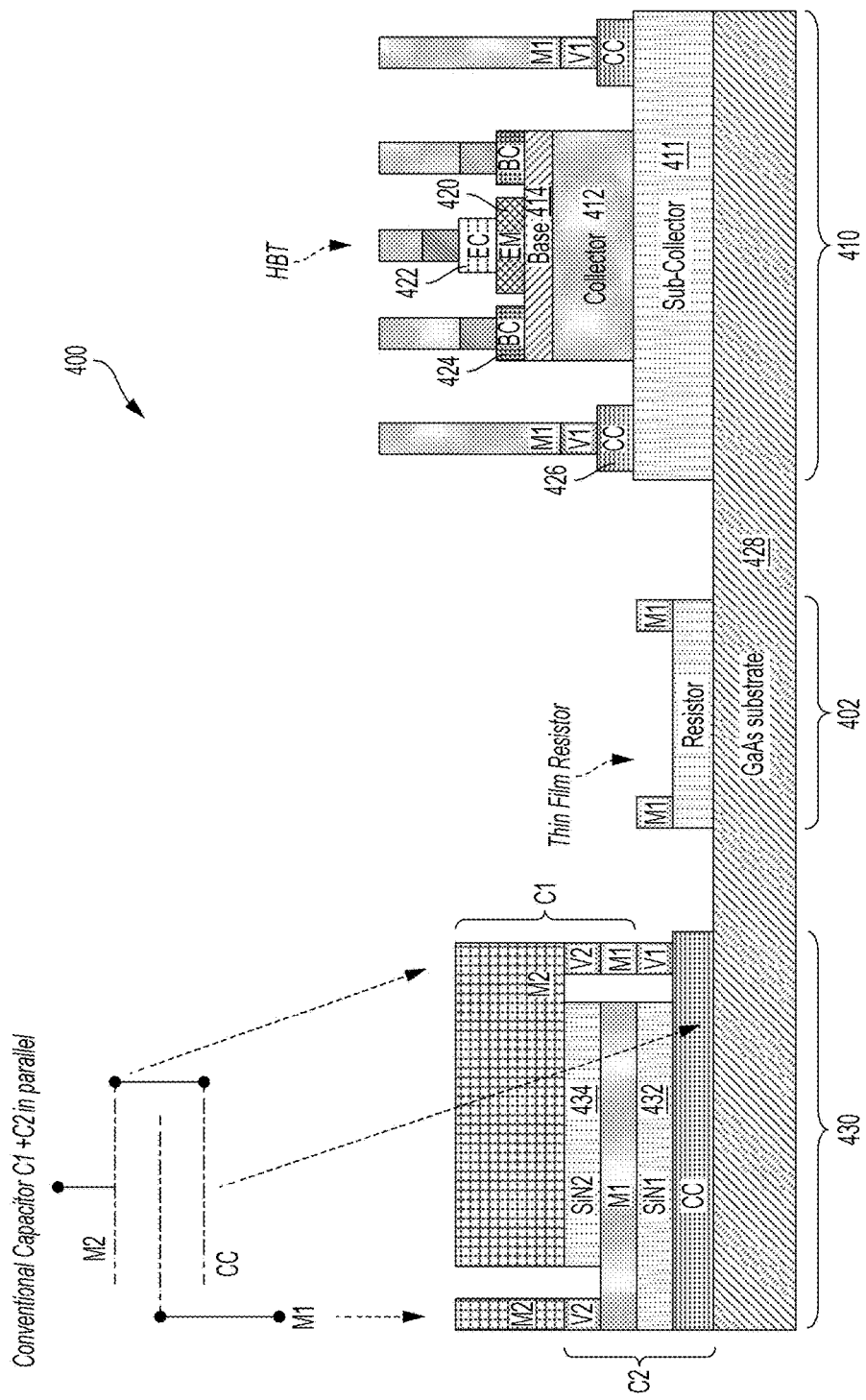
FIG. 4 shows a heterojunction bipolar transistor (HBT) chip integrating a compound semiconductor transistor, a resistor, and a compound semiconductor capacitor.

FIG. 4 shows a heterojunction bipolar transistor chip 400, integrating a compound semiconductor transistor (e.g., heterojunction bipolar transistor (HBT) 410), a resistor 402 (e.g., a thin film resistor), and a compound semiconductor MIM capacitor 430. Although illustrated as integrating the HBT 410 and the compound semiconductor MIM capacitor 430, the compound semiconductor MIM capacitor 430 may be integrated with a field effect transistor or other like compound semiconductor device, such as a high electron mobility transistor (HEMT).

The HBT chip 400 may provide, for example, an HBT-based power amplifier, such as the power amplifier 344 of FIG. 3. The HBT 410 includes an emitter 420 (EM), a base 414 contacting the emitter 420, a collector 412 contacting the base 414. and a sub-collector 411 contacting the collector 412. The emitter 420 includes an emitter contact 422 (EC), the base 414 includes base contacts 424 (BC), and the sub-collector 411 includes collector contacts 426 (CC). The HBT 410 is supported by a compound semiconductor substrate 428 (e.g., gallium arsenide (GaAs)). In addition, a resistor 402 and a compound semiconductor MIM capacitor 430 are arranged adjacent to the HBT 410. A conductive material of the resistor 402 may include, but is not limited to, tantalum nitride (TaN), tungsten silicon (WSi), nickel chromium (NiCr), cobalt nitride (CoN), or other like conductive material. A thickness of the resistor 402 may be in the range of ten angstroms (10 A) to one-thousand angstroms (1000 A).

As noted, the compound semiconductor MIM capacitor 430 may occupy as much as twenty percent (20%) of a chip area of the HBT chip 400. The large size of the compound semiconductor MIM capacitor 430 is due to the HBT-process used to form the compound semiconductor MIM capacitor 430. In particular, an HBT dielectric (e.g., silicon nitride (SiN)) used to form the compound semiconductor MIM capacitor 430 generally exhibits a low dielectric constant (e.g., ~7). Consequently, a capacitance density of the compound semiconductor MIM capacitor 430 is low because capacitance density is directly proportional to the dielectric constant of the insulator. A capacitance density of the compound semiconductor MIM capacitor 430 is increased in the stacked MIM capacitor configuration shown in FIG. 4.

In this arrangement, three electrodes are used for supporting two parallel capacitors. A first capacitor (C1) is formed between a first conductive interconnect (M1) electrode, a second dielectric layer 434 (First $SiN_x$) and a second conductive interconnect (M2) electrode. The second capacitor (C2) is formed between the (M1) electrode, a first dielectric layer 432 (Second $SiN_x$) and a collector contact (CC) metal. The first capacitor C1 (e.g., first capacitive component) may exhibit a capacitance density of six hundred picofarads per meter squared (600 $pF/mm^2$). The second capacitor C2 (e.g., second capacitive component) may exhibit a capacitance density of three hundred picofarads per meter squared (300 $pF/mm^2$), for a total stacked capacitance density of 900 $pF/mm^2$. By contrast, a silicon based, CMOS capacitor may exhibit a capacitance density of four-thousand femtofarads per meter squared (4000 $fF/mm^2$), while occupying less than five percent (5%) of a chip area.

Figure 5A:
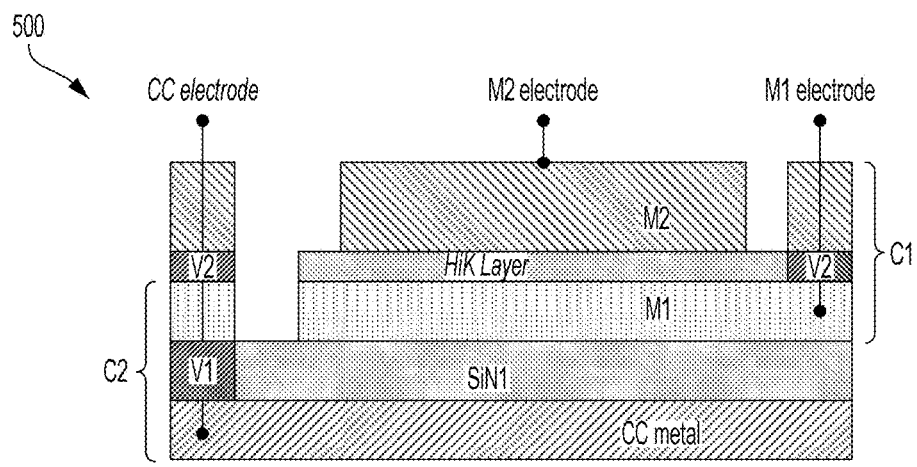
FIGS. 5A to 5C illustrate a high density, compound semiconductor MIM capacitor in a parallel capacitor configuration, in accordance with aspects of the present disclosure.
Figure 5B:
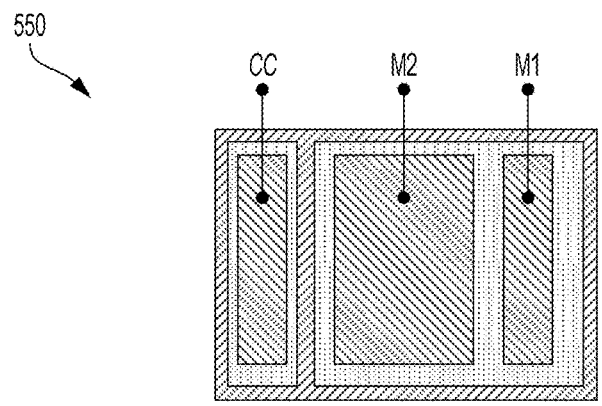
Figure 5C:
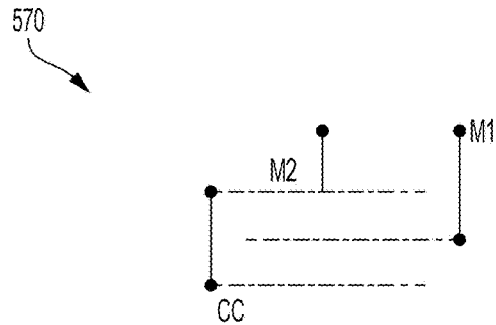

FIGS. 5A to 5C illustrate a high density, compound semiconductor MIM capacitor in a parallel capacitor configuration, in accordance with aspects of the present disclosure. FIG. 5A illustrates a cross section view of a compound semiconductor MIM capacitor 500 according to aspects of the present disclosure. In some embodiments, the term "on" may refer to physical contact. In some embodiments, the term "on" may refer to contact via one or more intervening layers to give effects of the present disclosure. The compound semiconductor MIM capacitor 500 may include a collector contact layer (CC metal) supporting a first dielectric layer SiN1 and via one (V1). The first conductive interconnect M1 is arranged on the first dielectric layer SiN1. A conductive material of the CC metal may include, but is not limited to, titanium (Ti), platinum (Pt), gold (Au), cobalt (Co), or other like conductive material. A thickness of the CC metal may be in the range of ten angstroms (10 A) to one-thousand angstroms (1000 A).

In this arrangement, a high-K dielectric layer (HiK Layer) is deposited on the first conductive interconnect M1, in place of a second dielectric layer. In addition, the second conductive interconnect M2 is arranged on the HiK Layer to form a first capacitive component (e.g., capacitor C1). An M1 electrode electrically contacts the first conductive interconnect M1 through via one (V1), and an M2 electrode electrically contacts the second conductive interconnect M2 to access the first capacitor C1. In addition, a collector contact (CC) electrode electrically contacts the CC metal through via one V1 and via two V2 to access a second capacitive component (e.g., capacitor C2). A material of the first conductive interconnect M1 and the second conductive interconnect M2 may include, but is not limited to, tungsten (W), copper (Cu), aluminum (Al), cobalt (Co), or other like conductive material. A thickness of the first conductive interconnect M1 and the second conductive interconnect M2 may be in the range of five tenths of a micrometer (0.5 μm) to between four (4) and eight (8) micrometers.

In one arrangement, the HiK Layer is hafnium oxide ($HfO_2$), or other like high-K dielectric, including, but not limited to, aluminum oxide ($Al_2O_3$), lanthanum oxide ($La_2O_3$), yttrium oxide ($Y_2O_3$), lanthanum aluminate ($LaAlO_3$), strontium titanate (SrTiO), zirconium ($ZrO_2$), silicon oxynitride (SiON), silicon oxynitride carbon, tantalum pentoxide ($Ta_2O_5$), titanium oxide ($TiO_2$), ceric oxide ($CeO_2$), bromine zirconium titanium oxide (BaZrTiO3), (Bz, Ca, Sr)F2, barium strontium titanium oxide (BaSrTiO3), lead nanthanum titanium oxide (PbLaZrTiO3), lead titanium oxide (PbTiO3), lead magnesium niobium oxide (PbMgNbO3), magnesium oxide (MgO), or zinc oxide (ZnO). A thickness of the HiK Layer may be in the range of two nanometers (2 nm) to one-hundred nanometers (100 nm). Use of these high-K dielectrics may substantially increase a capacitance density (e.g., 300%) of the compound semiconductor MIM capacitor 500, while incurring negligible impact from a back-end-of-line metal capacitance.

FIG. 5B shows a top view 550 and FIG. 5C shows a simplified, terminal view of the compound semiconductor MIM capacitor 500 of FIG. 5A, according to aspects of the present disclosure. In the arrangement of FIG. 5B, the use of the HiK Layer enables a substantial size reduction of an M2 plate of the first capacitor C1. Reduction of the M2 plate may yield a twenty percent (20%) capacitor area reduction. The capacitor area reduction may amount to approximately seven percent (7%) of the total chip area, which yields a substantial die cost reduction (e.g., 13%).

Figure 6A:
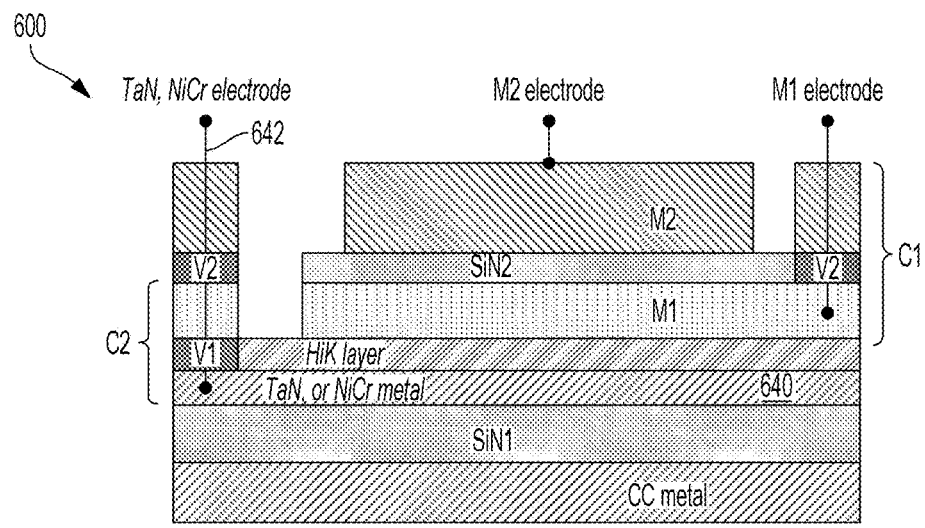
FIGS. 6A to 6C illustrate a high density, compound semiconductor MIM capacitor in an alternative, parallel capacitor configuration, in accordance with aspects of the present disclosure.
Figure 6B:
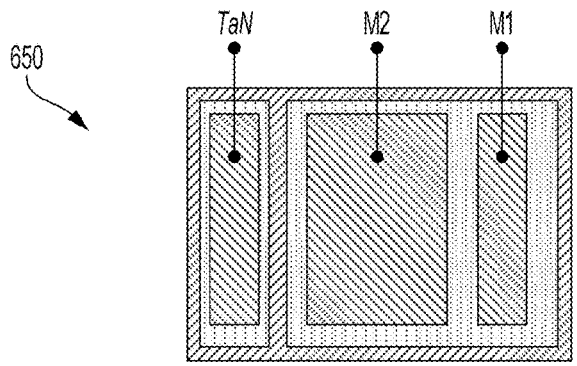
Figure 6C:
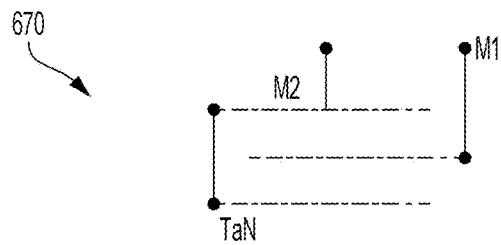

FIGS. 6A to 6C illustrate a high density, compound semiconductor MIM capacitor 600 in an alternative, parallel capacitor configuration, in accordance with aspects of the present disclosure. In this arrangement, a conductive electrode layer 640 (e.g., tantalum nitride (TaN) or nickel chromium (NiCr) metal) is deposited on the first dielectric layer SiN1. In addition, a high-K layer (HiK layer) is deposited on the conductive electrode layer 640 to form a second high density capacitor C2. This HiK layer may be referred to as a third dielectric layer.

Based on the simplified, terminal view 670 of the compound semiconductor MIM capacitor 600 of FIG. 6C, a conductive contact electrode 642 electrically contacts the conductive electrode layer 640 through via one V1 and via two V2. Access to the high density second capacitor C2 is provided through the conductive contact electrode 642 and the M1 electrode. In addition, the M1 electrode electrically contacts the first conductive interconnect M1 through via two V2, and an M2 electrode electrically contacts the second conductive interconnect M2. In this arrangement, access to the low density capacitor C1 is provided through the M1 electrode and the M2 electrode.

As seen in the top view 650 (FIG. 6B), the use of the HiK layer enables a substantial size reduction of the M2 plate of the first capacitor C1. Reduction of the M2 plate may also yield a substantial capacitor area reduction. The capacitor area reduction may amount to significant reduction of the total chip area, which decreases die cost. In addition, a material of the conductive electrode layer 640 may be repurposed from a high precision metal resistor, such as the resistor 402 of FIG. 4.

Figure 7A:
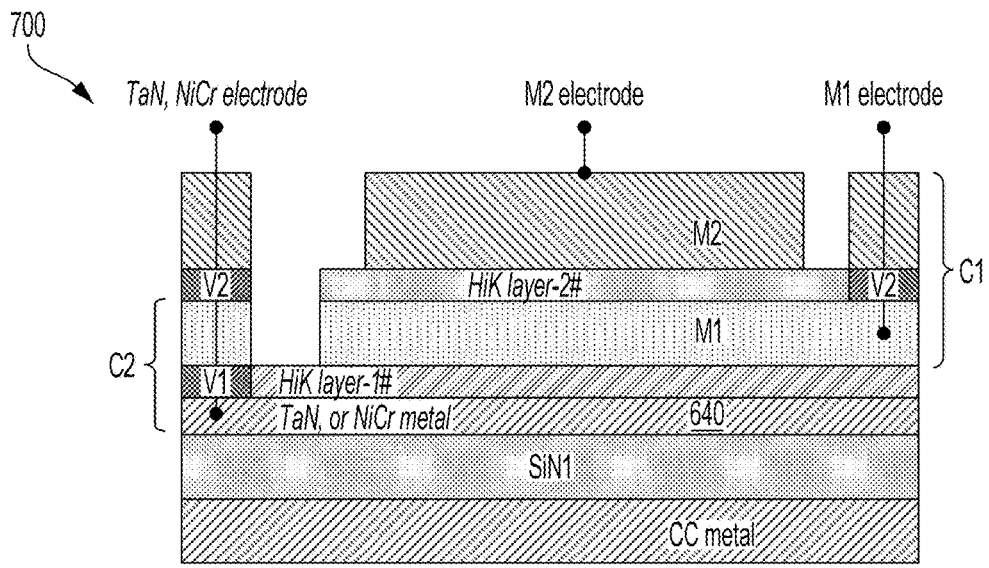
FIGS. 7A to 7C illustrate a high density, compound semiconductor MIM capacitor in a further alternative, parallel capacitor configuration, in accordance with aspects of the present disclosure.
Figure 7B:
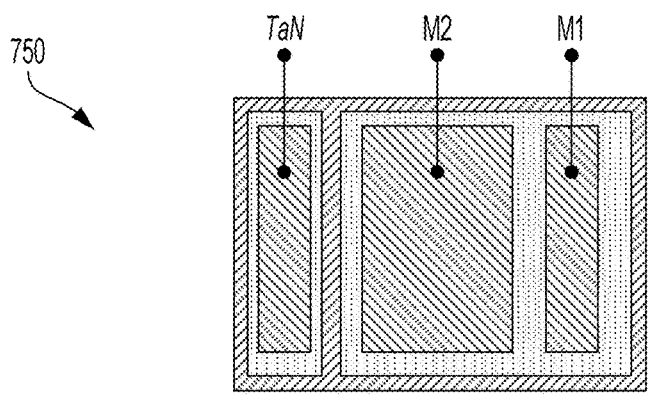
Figure 7C:
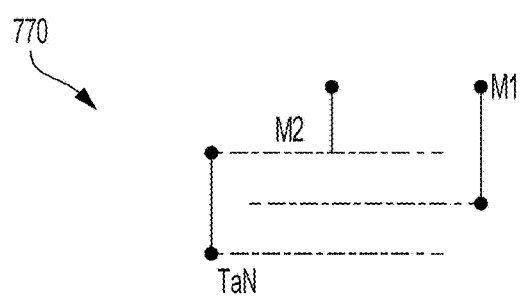

FIGS. 7A to 7C illustrate a high density, compound semiconductor MIM capacitor 700 in a further alternative, parallel capacitor configuration, in accordance with aspects of the present disclosure. In this arrangement, a second high-K layer (HiK Layer-2#) is deposited on the M1 plate of a first high density capacitor C1, to replace the second dielectric layer SiN2, as shown in FIG. 6A. Similar to the configuration in 6A, a first high-K layer (HiK Layer-1#) is deposited on the conductive electrode layer 640 to form the second high density capacitor C2. In addition, the conductive electrode layer 640 is deposited on the first dielectric layer SiN1.

Based on the simplified, terminal view 770 of the compound semiconductor MIM capacitor 700 of FIG. 7C, access to the first high density capacitor C1 is provided through the M1 electrode and the M2 electrode. In this arrangement, the M1 electrode electrically contacts the M1 plate through via two V2 and the M2 electrode electrically contacts the M2 plate of the first high density capacitor. In addition, the conductive contact electrode 642 also electrically contacts the conductive electrode layer 640 through via one V1 and via two V2. Access to the second high density capacitor C2 is also provided through the conductive contact electrode 642 and the M1 electrode.

In the top view 750 of FIG. 7B, the use of the first HiK Layer-1# and the second HiK layer-2# provides a substantial increase in the capacitance density (e.g., a 500% improvement). This arrangement also yields a substantial capacitor area reduction (e.g., 20%). The capacitor area reduction may amount to a significant reduction (e.g., 4%) of the total chip area thereby reducing die cost (e.g., 16%).

Figure 8A:
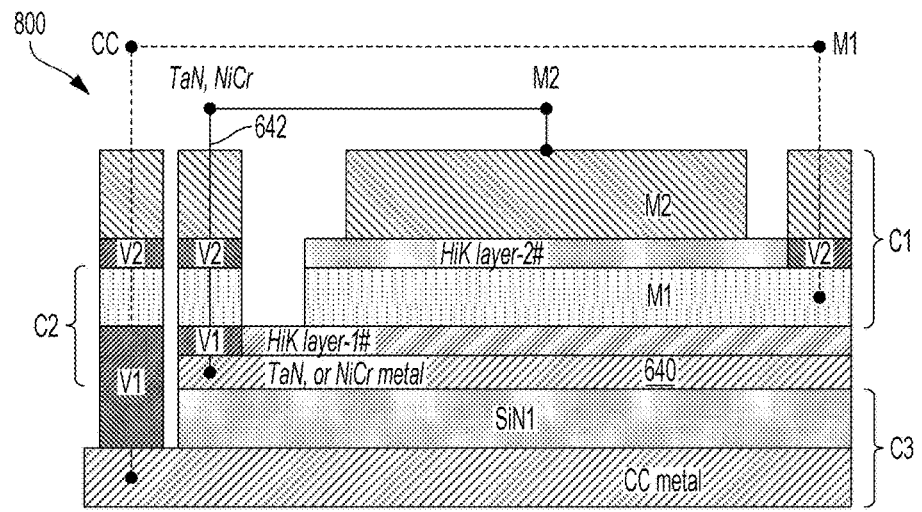
FIGS. 8A to 8C illustrate a high density, compound semiconductor MIM capacitor in another alternative, parallel capacitor configuration, in accordance with aspects of the present disclosure.
Figure 8B:
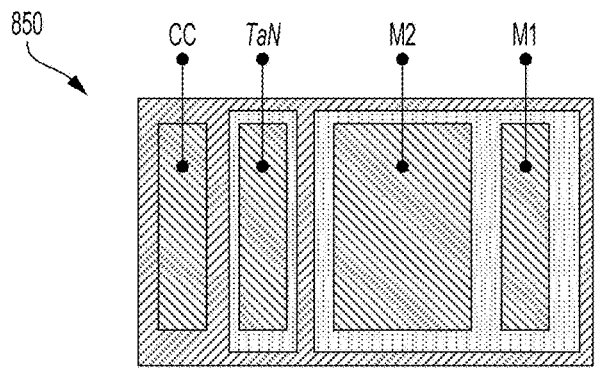
Figure 8C:
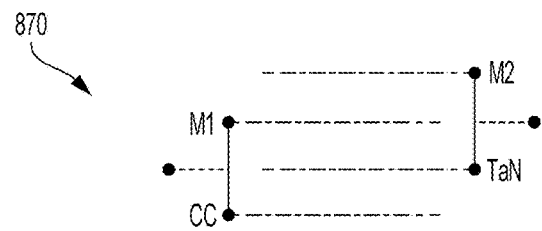

FIGS. 8A to 8C illustrate a high density, compound semiconductor MIM capacitor 800 in another alternative, parallel capacitor configuration, in accordance with aspects of the present disclosure. In this arrangement, a second high-K layer (HiK Layer-2#) is also deposited on the M1 plate of a first high density capacitor C1, to replace the second dielectric layer SiN2, as shown in FIG. 6A. Similar to the configuration in 7A, the first high-K layer (HiK Layer-1#) is deposited on the conductive electrode layer 640 to form the second high density capacitor C2. In addition, the conductive electrode layer 640 is deposited on the first dielectric layer SiN1.

In this arrangement, the CC electrode electrically contacts the CC metal through via one V1 and via two V2. This arrangement of the CC electrode provides a third capacitive component (e.g., capacitor C3), in parallel with the first high density capacitor C1 and second high density capacitor C2. The third capacitor C3 (e.g., third capacitive component) may include the CC metal as a first plate, the first dielectric layer SiN1 as a capacitor dielectric, and the conductive electrode layer 640 as a second plate.

Based on the simplified, terminal view 870 of the compound semiconductor MIM capacitor 800 of FIG. 8C, the CC electrode electrically contacts the CC metal through via one V1 and via two V2. Access to the third capacitor C3 is provided through the conductive contact electrode 642 and the CC electrode. In addition, the M1 electrode electrically contacts the first conductive interconnect M1 through via two V2, and an M2 electrode electrically contacts the second conductive interconnect M2. In this arrangement, access to the first high density capacitor C1 is provided through the M1 electrode and the M2 electrode. Access to the second high density capacitor is provided through the M1 electrode and the conductive contact electrode 642.

In the top view 850 of FIG. 8B, the addition of the third capacitor C3 provides a further increase in the capacitance density (e.g., a 560% improvement). This arrangement also yields a substantial capacitor area reduction (e.g., 20%). The capacitor area reduction may amount to a significant reduction (e.g., 3.5%) of the total chip area, again saving costs (e.g., 16.5%). This substantial die cost reduction is achieved without modifying an HBT process.

Although shown to include three parallel capacitors (e.g., C1, C2, and C3), it should be recognized that the use of additional interconnect layers (e.g., M3, M4, etc.) and dielectric layers to enable formation of additional parallel or series coupled capacitors are contemplated according to aspects of the present disclosure. For example, a fourth capacitor C4 (e.g, fourth capacitive component) may be formed from a third conductive interconnect M3 and a fourth dielectric layer on the first conductive interconnect M1 or the second conductive interconnect M2.

According to additional aspects of the present disclosure, a compound semiconductor material may include, but is not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N). These are exemplary only, and other materials are possible.

Figure 9:
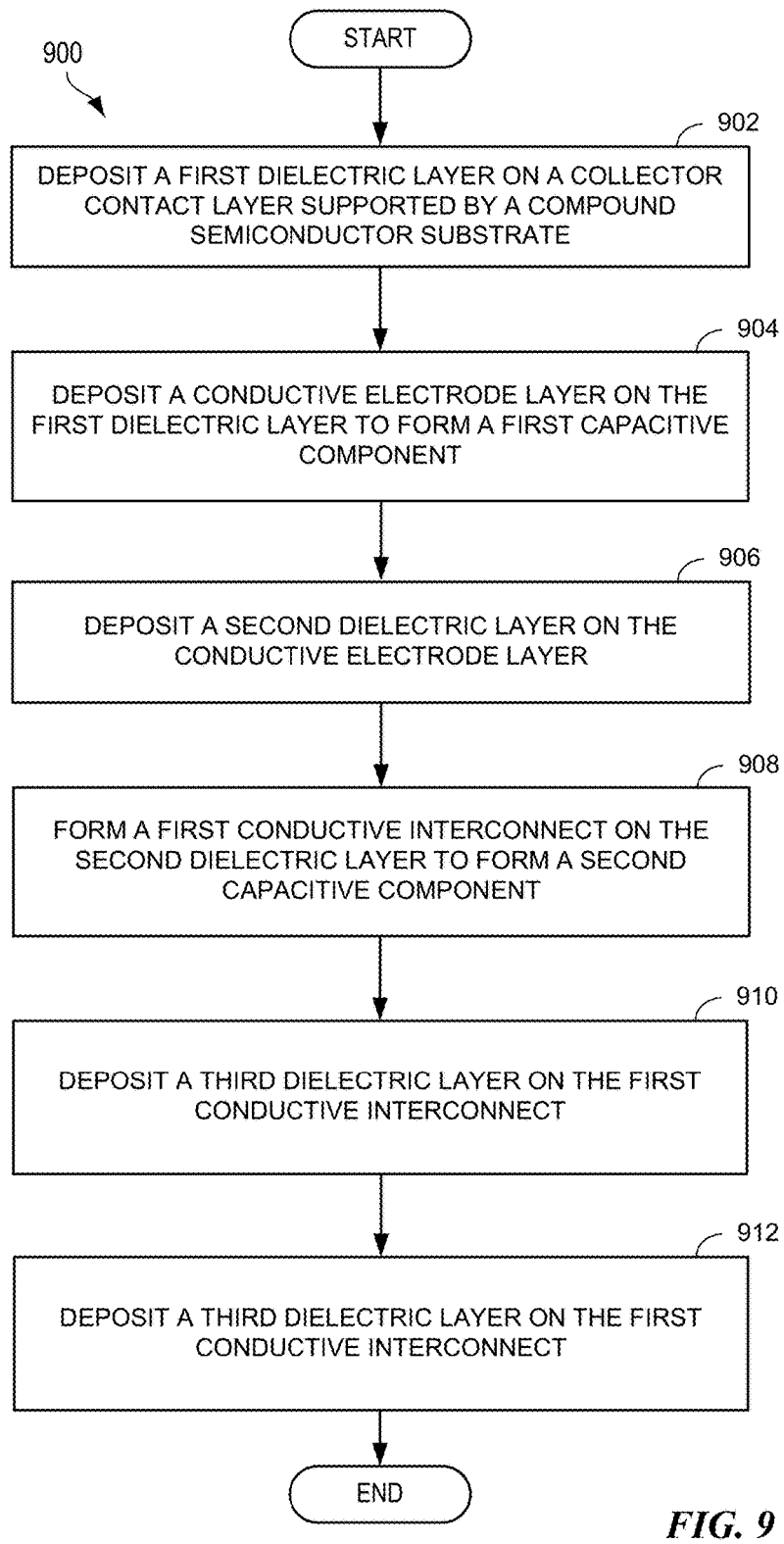
FIG. 9 is a flow diagram illustrating a method of making a high density metal-insulator-metal (MIM) capacitor, in accordance with aspects of the present disclosure.

FIG. 9 is a flow diagram illustrating a method of making a high density metal-insulator-metal (MIM) capacitor, in accordance with aspects of the present disclosure. The blocks in the method 900 can be performed in or out of the order shown, and in some aspects, can be performed at least in part in parallel.

The method 900, begins at block 902, in which a first dielectric layer is deposited on a collector contact layer supported by a compound semiconductor substrate. For example, a first dielectric layer SiN1 is deposited on the CC metal, as shown in FIG. 5A. Alternatively, a high-K dielectric layer may be deposited on the CC metal to increase a capacitance density. At block 904, a conductive electrode layer is deposited on the first dielectric layer to form a first capacitive component. For example, the conductive electrode layer 640 is deposited on the first dielectric layer SiN1 to form the third capacitor C3. The third capacitor C3 may be converted into a high density capacitor by replacing the first dielectric layer SiN1 with a high-K dielectric.

Referring again to FIG. 9, at block 906, a second dielectric layer is deposited on the conductive electrode layer. For example, as shown in FIGS. 8A, the HiK layer-1# is deposited on the conductive electrode layer 640. At block 908, a first conductive interconnect is formed on the second dielectric layer to form a second capacitive component. For example, as shown in FIG. 8A, the first conductive interconnect M1 is formed on the HiK layer-1# to form the second high density capacitor C2. At block 910, a third dielectric layer is deposited on the first conductive interconnect. For example, the HiK layer-2# may be deposited on the first conductive interconnect M1. At block 912, a second conductive interconnect is formed on the third dielectric layer to form a third capacitive component. For example, the second conductive interconnect M2 is formed on the HiK layer-2# to form the first high density capacitor C1 (first capacitive component).

An HBT chip may integrate a resistor, a capacitor, and a heterojunction bipolar transistor to provide, for example, a power amplifier. Integration of the high density compound semiconductor MIM capacitor in the HBT chip is performed without modification of the HBT process and without sacrificing performance of the HBT. Integration of the high density compound semiconductor MIM capacitor in the HBT chip also does not involve an additional mask, while reducing a footprint of the compound semiconductor MIM capacitor.

According to a further aspect of the present disclosure, a metal-insulator-metal capacitor is described. The MIM capacitor may include means for supporting the MIM capacitor. The supporting means may, for example, include compound semiconductor substrate 428, as shown in FIG. 4. In another aspect, the aforementioned means may be any layer, module, or any apparatus configured to perform the functions recited by the aforementioned means.

Figure 10:
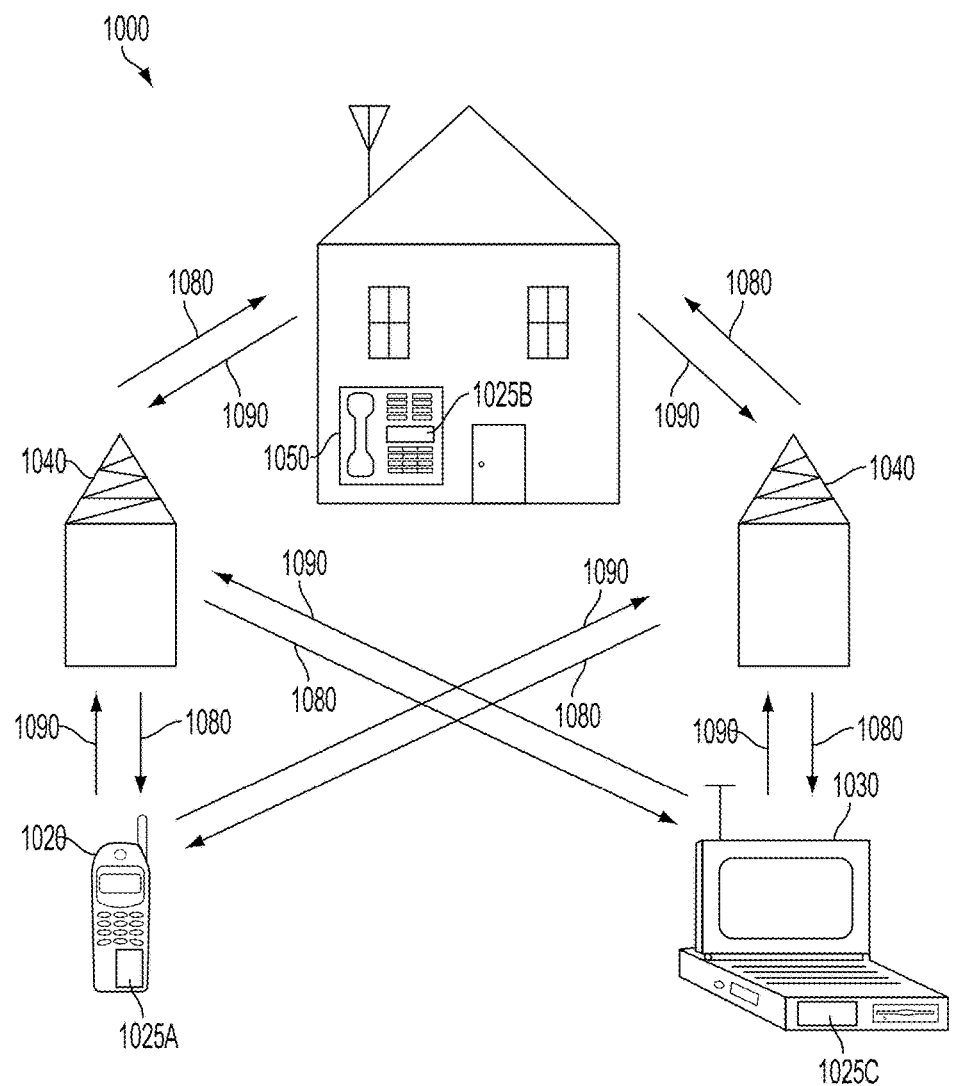
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed compound semiconductor MIM capacitor. It will be recognized that other devices may also include the disclosed compound semiconductor MIM capacitor, such as the base stations, user equipment, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed compound semiconductor MIM capacitor.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A metal-insulator-metal (MIM) capacitor, comprising:
   a compound semiconductor substrate;
   a collector contact layer directly on the compound semiconductor substrate;

a first dielectric layer on the collector contact layer and substantially coplanar with a sub-collector layer directly on the compound semiconductor substrate;
a conductive electrode layer on the first dielectric layer, a first capacitive component comprising the collector contact layer, the conductive electrode layer, and the first dielectric layer;
a second dielectric layer on the conductive electrode layer;
a first conductive interconnect on the second dielectric layer, a second capacitive component comprising the first conductive interconnect, the conductive electrode layer and the second dielectric layer;
a third dielectric layer on the first conductive interconnect; and
a second conductive interconnect on the third dielectric layer, a third capacitive component comprising the second conductive interconnect, the first conductive interconnect and the third dielectric layer, and arranged in parallel with the second capacitive component and the first capacitive component.

2. The MIM capacitor of claim 1, in which the first dielectric layer, the second dielectric layer, and/or the third dielectric layer comprises a high-K dielectric layer.

3. The MIM capacitor of claim 1, further comprising:
a fourth dielectric layer; and
a third conductive interconnect, a fourth capacitive component comprising the third conductive interconnect, the fourth dielectric layer and one of the first conductive interconnect and the second conductive interconnect.

4. The MIM capacitor of claim 1, in which the conductive electrode layer comprises tantalum nitride (TaN) or nickel chromium (NiCr).

5. The MIM capacitor of claim 1, integrated with a resistor fabricated from a material of the conductive electrode layer.

6. The MIM capacitor of claim 1, in which the compound semiconductor substrate comprises indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N).

7. The MIM capacitor of claim 1, integrated with a heterojunction bipolar transistor (HBT) on the sub-collector layer and in an HBT chip.

8. The MIM capacitor of claim 7, in which the HBT chip is incorporated into at least one of a music player, a video player, an entertainment unit, a navigation device, a communications device, a personal digital assistant (PDA), a fixed location data unit, a mobile phone, and a portable computer.

9. A method of making a high density metal-insulator-metal (MIM) capacitor, comprising:
depositing a first dielectric layer on a collector contact layer directly on a compound semiconductor substrate, the dielectric layer substantially coplanar with a sub-collector layer directly on the compound semiconductor substrate;
depositing a conductive electrode layer on the first dielectric layer to form a first capacitive component;
depositing a second dielectric layer on the conductive electrode layer;
forming a first conductive interconnect on the second dielectric layer to form a second capacitive component;
depositing a third dielectric layer on the first conductive interconnect; and
forming a second conductive interconnect on the third dielectric layer to form a third capacitive component arranged in parallel with the second capacitive component and the first capacitive component.

10. The method of claim 9, in which depositing the second dielectric layer comprises depositing a high-K dielectric layer on the conductive electrode layer.

11. The method of claim 9, further comprising:
depositing a fourth dielectric layer on the second conductive interconnect; and
depositing a third conductive interconnect on the fourth dielectric layer to form a fourth capacitive component.

12. The method of claim 9, in which depositing the conductive electrode layer comprises depositing tantalum nitride (TaN) or nickel chromium (NiCr) on the first dielectric layer.

13. The method of claim 9, further comprising fabricating a resistor on the compound semiconductor substrate from a material of the conductive electrode layer.

14. The method of claim 9, further comprising:
integrating the MIM capacitor with a heterojunction bipolar transistor (HBT) on the sub-collector layer and in an HBT chip; and
integrating the HBT chip into a wireless transceiver, the wireless transceiver incorporated into at least one of a music player, a video player, an entertainment unit, a navigation device, a communications device, a personal digital assistant (PDA), a fixed location data unit, a mobile phone, and a portable computer.

15. A metal-insulator-metal (MIM) capacitor, comprising:
means for supporting the MIM capacitor;
a collector contact layer directly on the means for supporting;
a first dielectric layer on the collector contact layer and substantially coplanar with a sub-collector layer directly on the means for supporting;
a conductive electrode layer on the first dielectric layer, a first capacitive component comprising the collector contact layer, the conductive electrode layer, and the first dielectric layer;
a second dielectric layer on the conductive electrode layer;
a first conductive interconnect on the second dielectric layer, a second capacitive component comprising the first conductive interconnect, the conductive electrode layer and the second dielectric layer;
a third dielectric layer on the first conductive interconnect; and
a second conductive interconnect on the third dielectric layer, a third capacitive component comprising the second conductive interconnect, the first conductive interconnect and the third dielectric layer, and arranged in parallel with the second capacitive component and the first capacitive component.

16. The MIM capacitor of claim 15, in which the first dielectric layer, the second dielectric layer, and/or the third dielectric layer comprises a high-K dielectric layer.

17. The MIM capacitor of claim 15, further comprising:
a fourth dielectric layer; and
a third conductive interconnect, a fourth capacitive component comprising the third conductive interconnect, the fourth dielectric layer and one of the first conductive interconnect and the second conductive interconnect.

18. The MIM capacitor of claim 15, in which the conductive electrode layer comprises tantalum nitride (TaN) or nickel chromium (NiCr).

19. The MIM capacitor of claim 15, integrated with a resistor fabricated from a material of the conductive electrode layer.

20. The MIM capacitor of claim 15, in which the means for supporting comprises indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N).

21. The MIM capacitor of claim 15, integrated with a heterojunction bipolar transistor (HBT) on the sub-collector layer and in an HBT chip.

22. The MIM capacitor of claim 21, in which the HBT chip is incorporated into at least one of a music player, a video player, an entertainment unit, a navigation device, a communications device, a personal digital assistant (PDA), a fixed location data unit, a mobile phone, and a portable computer.

\* \* \* \* \*